(12) United States Patent
Blawat et al.

(10) Patent No.: US 8,923,029 B2
(45) Date of Patent: Dec. 30, 2014

(54) FIELD PROGRAMMABLE READ-ONLY MEMORY DEVICE

(75) Inventors: Meinolf Blawat, Hannover (DE); Holger Kropp, Wedemark (DE)

(73) Assignee: Thomson Licensing, Boulogne, Billancourt (FR)

( * ) Notice: Subject to any disclaimer, the term of this patent is extended or adjusted under 35 U.S.C. 154(b) by 205 days.

(21) Appl. No.: 13/551,571

(22) Filed: Jul. 17, 2012

(65) Prior Publication Data

US 2013/0039115 A1    Feb. 14, 2013

(30) Foreign Application Priority Data

Aug. 10, 2011  (EP) .................................... 11306028

(51) Int. Cl.
| | |
|---|---|
| G11C 17/00 | (2006.01) |
| G11C 17/14 | (2006.01) |
| G11C 13/02 | (2006.01) |
| G11C 23/00 | (2006.01) |
| H01L 29/06 | (2006.01) |
| H01L 51/00 | (2006.01) |
| B82Y 10/00 | (2011.01) |

(52) U.S. Cl.
CPC ............... *G11C 17/14* (2013.01); *G11C 17/00* (2013.01); *G11C 2213/16* (2013.01); *G11C 13/025* (2013.01); *G11C 2213/19* (2013.01); *G11C 23/00* (2013.01); *H01L 29/0665* (2013.01); *H01L 51/0048* (2013.01); *B82Y 10/00* (2013.01); *G11C 2213/35* (2013.01); *Y10S 977/709* (2013.01); *Y10S 977/731* (2013.01); *Y10S 977/743* (2013.01); *Y10S 977/745* (2013.01)
USPC ............. 365/94; 365/164; 365/166; 977/709; 977/731; 977/743; 977/745

(58) Field of Classification Search
USPC ............ 365/94, 164, 166; 977/709, 731, 743, 977/745
See application file for complete search history.

(56) References Cited

U.S. PATENT DOCUMENTS

| | | | |
|---|---|---|---|
| 6,473,351 B2 * | 10/2002 | Tomanek et al. ............. | 365/215 |
| 7,382,648 B2 * | 6/2008 | Bockrath ....................... | 365/164 |
| 7,456,482 B2 * | 11/2008 | Busta et al. ................... | 257/415 |
| 7,675,768 B1 | 3/2010 | Kim | |
| 7,829,886 B2 * | 11/2010 | Maslov et al. .................. | 257/40 |
| 8,064,249 B2 * | 11/2011 | Jang et al. ..................... | 365/164 |
| 2004/0150472 A1 | 8/2004 | Rust | |
| 2006/0250843 A1 | 11/2006 | Bertin et al. | |
| 2007/0121362 A1 | 5/2007 | Jang et al. | |
| 2007/0132046 A1 | 6/2007 | Yoo et al. | |
| 2007/0171707 A1 | 7/2007 | Maslov et al. | |
| 2007/0230241 A1 | 10/2007 | Bockrath et al. | |
| 2008/0277718 A1 | 11/2008 | Ionescu et al. | |

OTHER PUBLICATIONS

Jeong Won Kang et al.: "Electrostatically telescoping nanotube nonvolatile memory device", Nanotechnology, IOP, Bristol, GB, vol. 18, No. 9, Mar. 7, 2007, p. 95705.
Bichoutskaia E et al: "Nanotube-based data storage devices", Materials Today, Elsevier Science, Kidlington, GB, vol. 11, No. 6, Jun. 1, 2008, pp. 38-43.
European Search Report dated Dec. 27, 2011.

* cited by examiner

*Primary Examiner* — Pho M Luu
(74) *Attorney, Agent, or Firm* — Jeffrey D. Carter

(57) ABSTRACT

The field programmable read-only memory device includes a memory cell having a switching element for storing bit information. The switching element provides a switchable electrical connection between a word line and a bit line and includes a static body and a movable connecting element. The switchable electrical connection is non-volatile.

16 Claims, 4 Drawing Sheets

FIELD PROGRAMMABLE READ-ONLY MEMORY DEVICE

This application claims the benefit, under 35 U.S.C. §119 of EP Patent Application 11306028.9, filed 10 Aug. 2011.

FIELD OF THE INVENTION

The invention relates to a field programmable read-only memory device comprising a memory cell having a switching element for storing bit information.

BACKGROUND

Data storage devices for archiving applications are a dynamic field of research. Research efforts are driven by the fact that more and more information is available as digital data, only. On the one hand, there is a large amount of digital data that has to be archived. On the other hand, the storage medium has to provide a long term data stability.

Especially for film studios producing an increasing number of digital movies, data archiving is an important issue. The annual average production of digital movie data of the major Hollywood studios is in the range of PByte and is steadily increasing. There is a need for storing a huge amount of data every single year. The digital movie data is one of the assets for each film studio. Movie data has to be available for repurposing movie data in future projects or for reissue of historical movies. Accordingly, there is an urgent need for every film studio to carefully archive the precious media data for long periods.

State of the art technologies, e.g. magnetic tape drives or hard disc drives allow storing a huge amount of data and provide acceptable data throughput rates. However, the data retention time of these technologies is limited to several years. For instance, a crucial restriction of hard disc drives is their limited life span of about five years. Today, there is no cheap and reliable mass storage technology that offers data retention times of at least several decades or even more. Due to this technical limitation, media production studios still use traditional analog media for archiving purposes. This however is a cost intensive and time consuming process. A digital long term stable archiving system allowing a digital-to-digital media backup is urgently needed for safeguarding the media industry's assets.

SUMMARY

It is an object of the invention, to provide a digital storage device having improved long term stability.

According to an aspect of the invention, a field programmable read-only memory (FPROM) device is provided. The FPROM-device comprises a memory cell having a switching element for storing bit information, wherein this switching element provides a switchable connection between a word line and a bit line. The switching element further comprises a static body and a moveable connecting element and the switchable electrical connection is non-volatile. The switching element may be an arbitrary micromechanical switching element comprising a static body and a moveable connecting element. Advantageously, a non-volatile FPROM-device providing long-term data stability may be provided. The FPROM-device is based on a micromechanical switching element. Accordingly, it is insusceptible to electromagnetic fields or shocks and is therefore highly reliable.

In another aspect of the invention, the moveable connecting element and the static body are permanently electrically connected. Further, the switching element may be a telescoping nanotube. Accordingly, the static body of the switching element is a first static support nanotube and the moveable connecting element of the switching element is a second nanotube that is moveable with respect to the first nanotube. Preferably, single walled carbon nanotubes are applied. The telescoping nanotube may have two alternative configurations. According to a first configuration, the moveable second nanotube encompasses the first static support nanotube and is sliding on an outer surface thereof. According to an alternative configuration, the static support nanotube encompasses the moveable nanotube which is sliding inside the first static support nanotube. In other words, an outer surface of the second nanotube is adjacent to an inner surface of the first static support nanotube.

Advantageously, the characteristic of a telescoping nanotube fits perfectly with the requirements of archiving applications. High storage capacities and long time data retention times may be provided at a comparably low price. In order to enhance data security, the freely moveable second nanotube may be hindered to move back. In other words, a non-volatile memory cell having a one time programmable (OTP) storage cell characteristic may be achieved by mechanically interlocking the moveable connecting element.

According to this aspect of the invention, the connecting element may be moveable between a first and a second end position. The switching element is conductive in the first end position and non-conductive in its second end position. For protection of bit information, the memory cell is configured to interlock the moveable connecting element in the first end position. Preferably, the memory cell is configured to interlock the moveable connecting element mechanically in the first end position. In other words, the switching element may be locked in its conductive state. Further, the memory cell may be configured to interlock the static body and the moveable connecting element with respect to each other. Accordingly, the static body may comprise a locking element for interlocking the moveable connecting element. Preferably, this locking element is a micromechanical snap-fit element. The micromechanical interlock between the static body and the moveable connecting element provides an OTP characteristic of the memory cell. Advantageously, this micromechanical memory device is insusceptible to electromagnetic fields or shocks and is therefore highly reliable and long term stable.

According to another aspect of the invention, the memory cell further comprises a top and a bottom electrode. The static body of the switching element may be coupled to the bottom electrode and the moveable connecting element may be configured to provide a mechanical contact to the top electrode in its first end position. The memory cell may be further configured to interlock the top electrode and the moveable connecting element with respect to each other.

While the FPROM-device according to the aforementioned aspects of the invention provides a mechanical interlock between the static body and the moveable connecting element, the FPROM-device according to the last mentioned aspects provides an interlock between the moveable connecting element and the top electrode. This interlock may be a mechanical interlock, too. Further, a chemical reaction between the moveable connecting element and the top electrode may be applied for mechanically interlocking these two parts. Accordingly, a free end of the moveable connecting element and/or a contact area of the top electrode may comprise an adhesive. Preferably, the adhesive is glue or a two-component adhesive.

BRIEF DESCRIPTION OF FIGURES

Further aspects of the invention will ensue from the following description of example embodiments with reference to the accompanying drawings, wherein.

DETAILED DESCRIPTION OF EXAMPLE EMBODIMENTS

Figure 1:
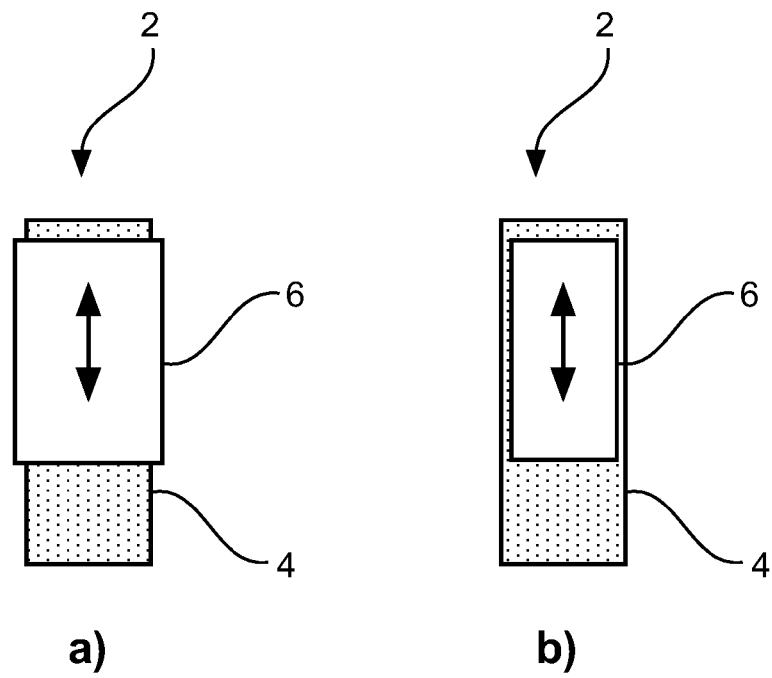
FIG. 1 is a simplified telescoping nanotube.

FIG. 1a is a simplified telescoping nanotube 2 comprising a first static support nanotube 4 as a static body and a moveable second nanotube 6 as a moveable connecting element. Preferably, the nanotubes 4, 6 are single walled carbon nanotubes. Within the context of this specification, they will be referred to as nanotubes only. The moveable nanotube 6 is sliding on an outer surface of the static support nanotube 4. The inverse concept is illustrated in FIG. 1b, showing a further simplified telescoping nanotube 2 having an outer static support nanotube 4 and an inner moveable nanotube 6. Within the context of this specification, a telescoping nanotube 2 may be either a telescoping nanotube 2 according to the concept of FIG. 1a or a telescoping nanotube 2 according to the concept that is illustrated in FIG. 1b.

Figure 2:
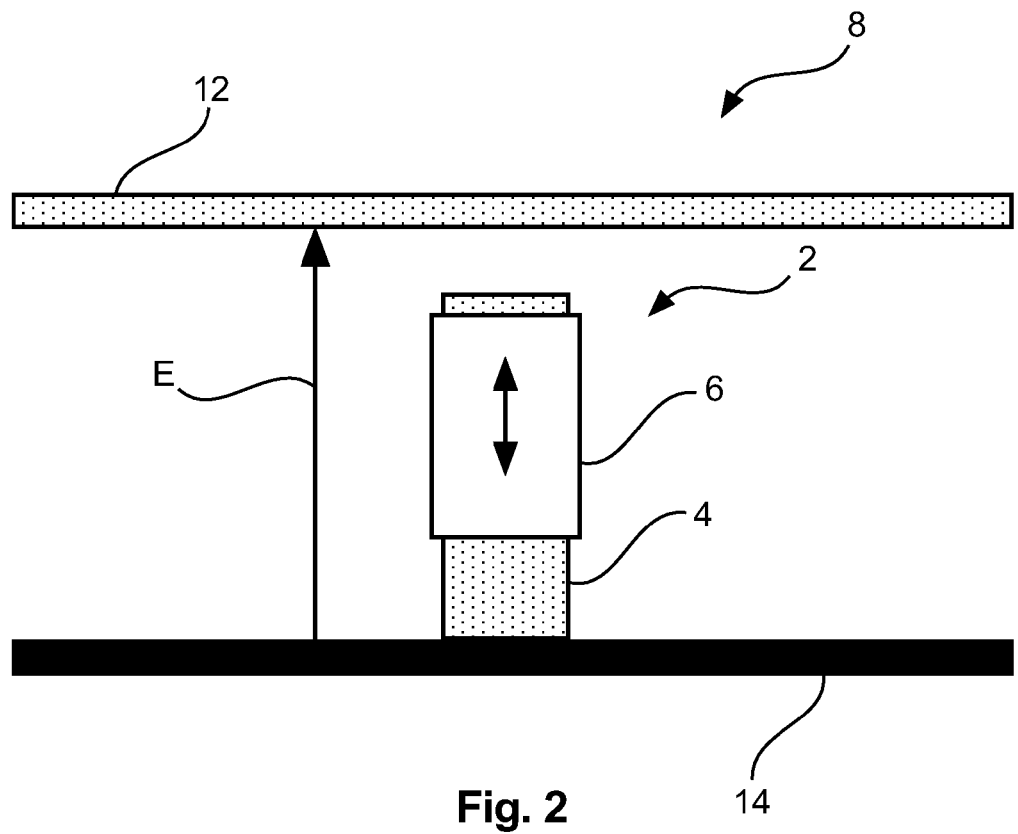
FIGS. 2 and 3 is a simplified memory cell in a non-conductive and in a conductive state, respectively, according to an embodiment of the invention.
Figure 8:
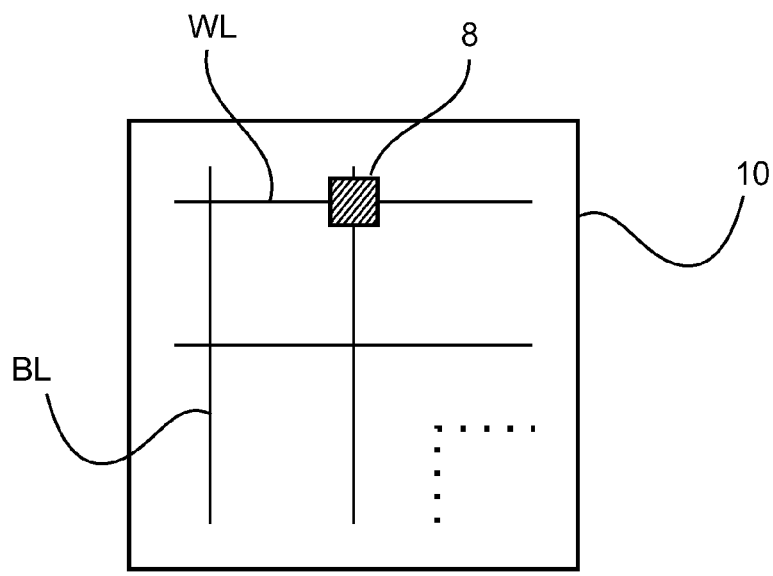
FIG. 8 is a simplified field programmable read-only memory (FPROM) device, according to an embodiment of the invention.

FIG. 2 is a simplified memory cell 8 that may be a part of a field programmable read-only memory (FPROM) device 10 (see FIG. 8, too). The memory cell 8 may be connected to a word line WL and a bit line BL of the FPROM-device 10. In FIG. 8, only two bit and word lines BL, WL are depicted for clarity reasons, further word and bit lines WL, BL are denoted by the respective dots in the FPROM-device 10.

Figure 3:
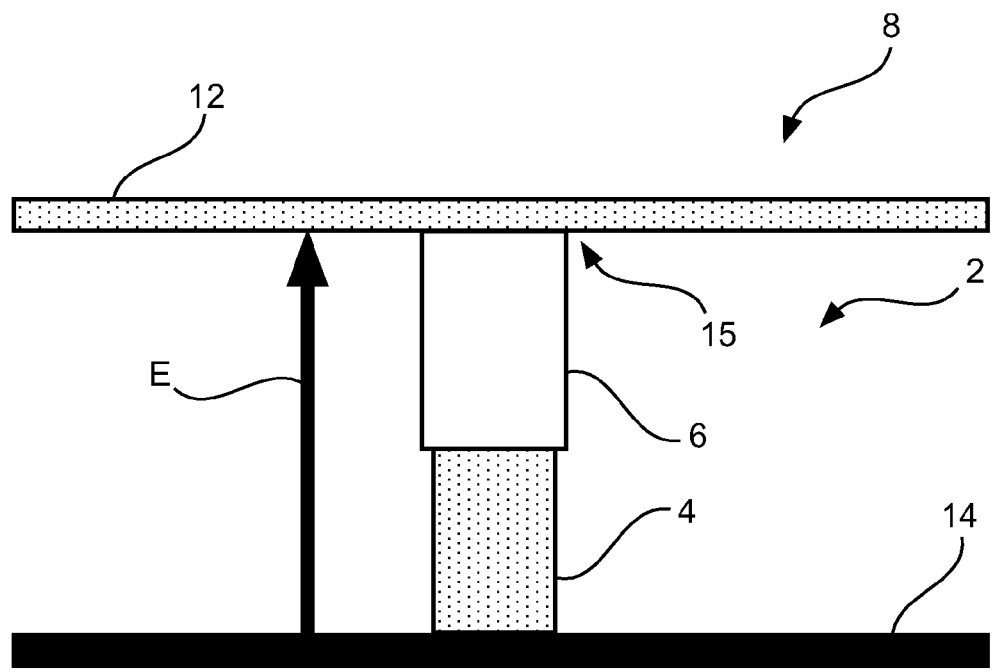

The memory cell 8 of FIG. 2 comprises a top electrode 12 and a bottom electrode 14 that may be connected to a bit line BL and word line WL, respectively. A telescoping nanotube 2 is arranged between the top and bottom electrode 12, 14 and provides a switching element for storing bit information. FIG. 2 is the non-conductive or opened state of the memory cell 8. The switching element, i.e. the telescoping element 2, provides no electrical contact between the top and bottom electrode 12, 14. This switching state may be assigned a logical "0". An electrical field E between the top and bottom electrode 12, 14 is schematically illustrated by an arrow pointing to the top electrode 12. If the electric field E increases and exceeds a certain threshold, the moveable nanotube 6 is pulled towards the top electrode 12. This configuration is illustrated in the further simplified view of FIG. 3. There is a permanent electrical contact between the movable nanotube 6 and the static support nanotube 4. Accordingly, the top and bottom electrode 12, 14 are connected via the telescoping nanotube 2 in this configuration that is referred to as a conductive or closed state of the memory cell 8. This state may be assigned a logical "1".

The electrical connection between the top and bottom electrode is—according to an embodiment of the invention—non-volatile. This non-volatility of the electrical connection may be provided by Van-der-Waals forces between an upper and free end 15 of the moveable nanotube 6 and a surface of the top electrode 12 that is facing the free end 15 of the telescoping nanotube 2. A mechanical interlock will safeguard the non-volatility of this connection, according to aspects of the invention. Further, each storage cell 8 may be configured to be writable only once and to hold the information nearly forever. This one time programmable (OTP) characteristic tailors the memory cell 8 for archiving applications. The mechanical interlock ensures that filed data may be tempered neither by accident nor by intention. Additionally, the information will be resistant to applied electric fields. No physical force may push the extended telescoping nanotube 2 back to its non-conductive state, if the moveable connecting element is locked.

Figure 4:
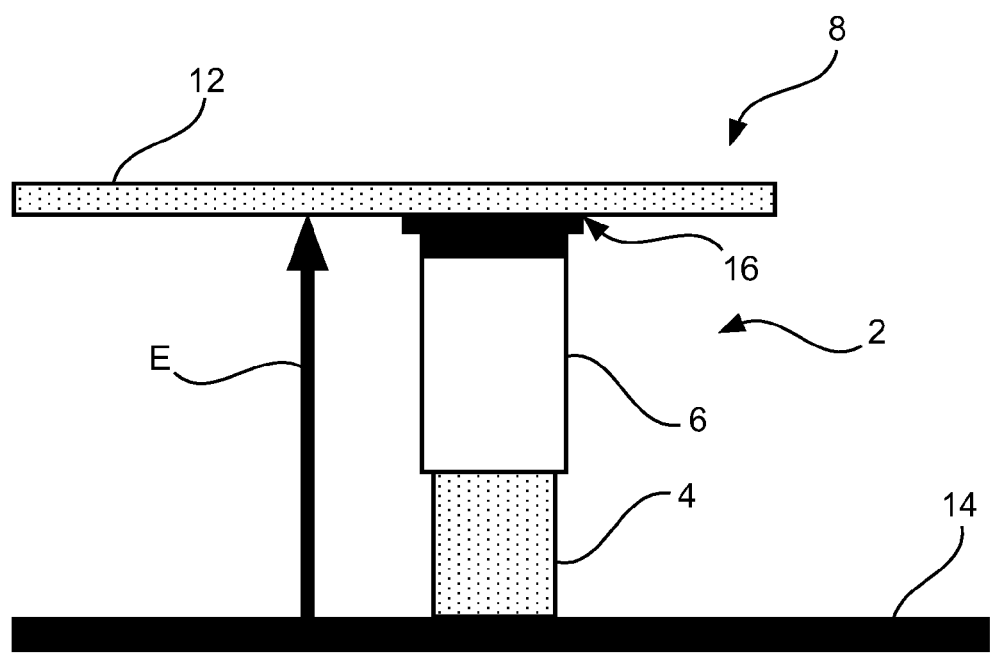
FIGS. 4 to 6 are simplified a memory cells, according to further embodiments of the invention.

FIG. 4 is a simplified memory cell 8 comprising a telescoping nanotube 2 having a moveable nanotube 6 that is locked to the top electrode 12. An adhesive 16 that is preferably conductive, is deposited onto the free end 15 of the moveable nanotube 6. If the telescoping nanotube 2 is extended by an electrical field E having a suitable strength to cause a sliding of the movable nanotube 6 on the outer surface of the static support nanotube 4, the adhesive 16 will hit the top electrode 12. The moveable nanotube 6 will stick intractably to the top electrode 12. Preferably, the adhesive 16 is glue. Accordingly, the storage cell 8 is locked in its closed state as it is illustrated in FIG. 4. This may be performed only once and therefore, the storage cell 8 has an OTP characteristic.

If the adhesive 16 is electrically conductive, the ON-state of the memory cell 8 may be detected by simply measuring its ohmic resistance. However, even non-conductive adhesives 16 may be applied. In this case, the switching state of the memory cell 8 may be determined by measuring its capacity. The opened and closed state may be distinguished because the capacity of the memory cell 8 is a function of a distance between the free end 15 of the moveable nanotube 6 and the top electrode 12.

Figure 5:
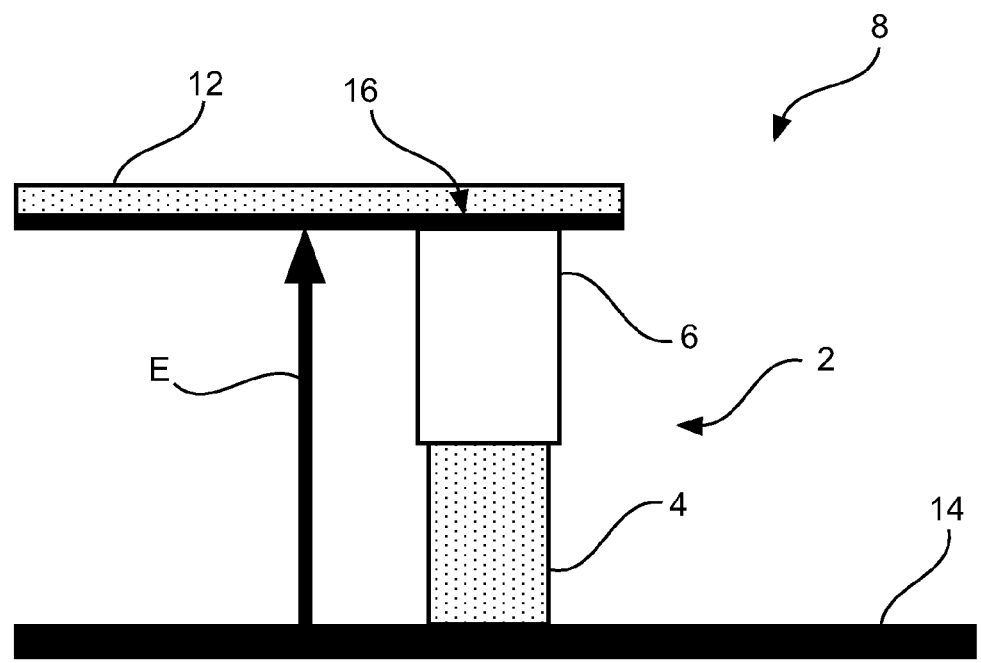

FIG. 5 is a simplified memory cell 8 for an FPROM-device 10 according to another embodiment of the invention. The moveable nanotube 6 is mechanically locked to the top electrode 12 by help of an adhesive. However, in contrast to the embodiment of FIG. 4, the adhesive 16 is not deposited on the free end 15 of the moveable nanotube 6 but on the top electrode 12. Preferably, a contact area of the top electrode 12 that is facing the free end 15 of the telescoping nanotube 2 may be coated with a suitable adhesive 16.

Figure 6:
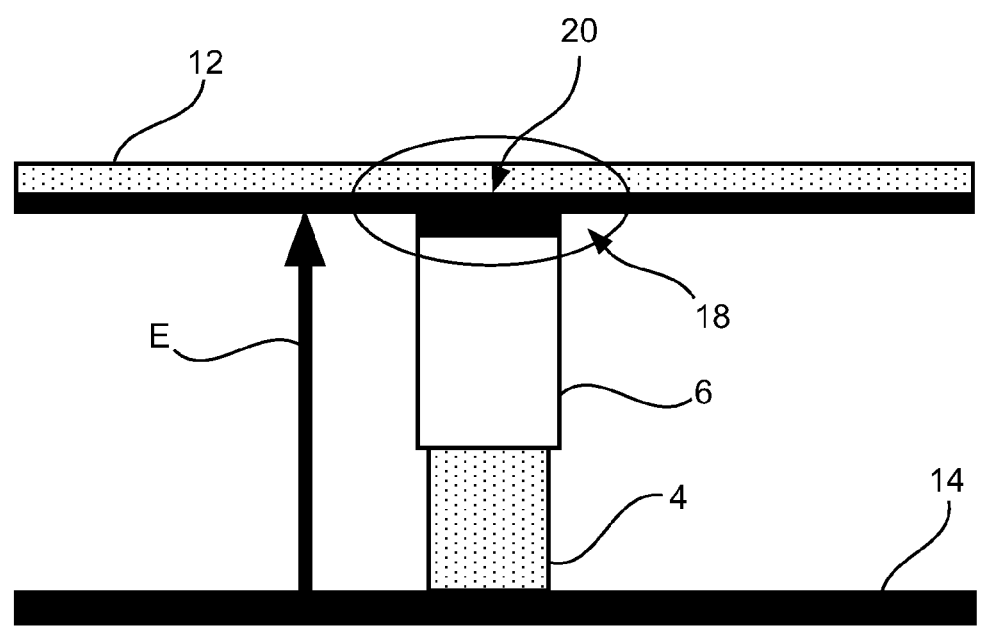

FIG. 6 is another simplified memory cell 8 for an FPROM-device 10, according to another embodiment of the invention. A mechanical interlock between the moveable nanotube 6 and the top electrode 12 is provided by applying a two-component adhesive. A first chemical agent 18 is deposited onto the free end 15 of the moveable nanotube 6. A second chemical agent 20 is deposited onto the contact area of the top electrode 12. If the first and second chemical agent 18, 20 approach each other, a chemical reaction between the two agents may take place. This will fix the moveable nanotube 6 to the top electrode 12. If the reaction product is electrically conductive, the switching state of the memory cell 8 may be determined by measuring its ohmic resistance, again. If the chemical reaction between the first and second agent 18, 20 leads to a non-conductive product, the switching status of the memory cell 8 may be determined by measuring its capacitance.

The abovementioned embodiments mainly focus on an mechanical interlock between the moveable nanotube 6 and the top electrode 12. In contrast, the following embodiment illustrates a mechanical interlock between the static support nanotube 4 and the moveable nanotube 6. The mechanic interlock between the two nanotubes 4, 6 may be realized by applying a variety of different micromechanical locking devices.

Figure 7:
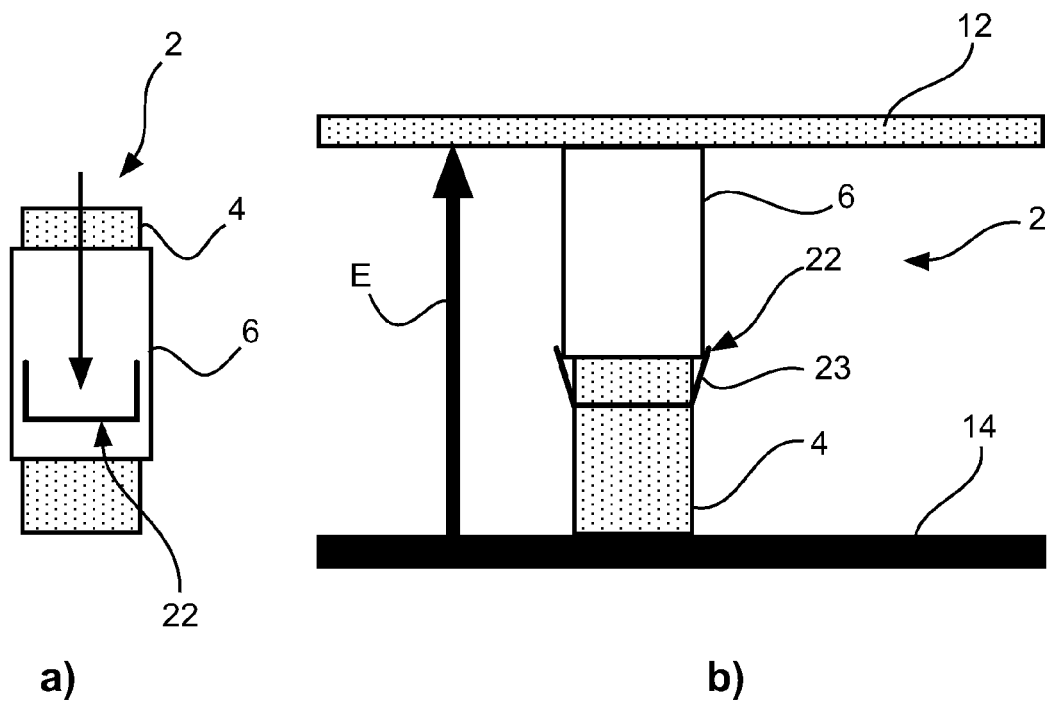
FIG. 7a is a simplified telescoping nanotube comprising a micromechanical snap-fit element.
FIG. 7b is a simplified memory cell comprising this telescoping nanotube, according to another embodiment of the invention

One embodiment is outlined in FIG. 7a showing a simplified telescoping nanotube 2 having a micromechanical snap-fit element 22. This snap-fit element 22 may be a micromechanical snap ring comprising retention arms 23 and a ring surrounding the static support nanotube 4. The snap-fit element 22 may be inserted in the annular clearance between the inner surface of the moveable nanotube 6 and the outer surface of the static support nanotube 4. This step is illustrated by the upside down arrow in FIG. 7a. The snap-fit element 22 is preloaded or pressurized in this configuration of the telescoping nanotube 2. FIG. 7b is a simplified memory cell 8 for an FPROM-device 10, according to another embodiment of the invention. By application of a suitable electrical field E, the moveable nanotube 6 of the telescoping nanotube 2 may expand. If a bottom edge of the moveable nanotube 6 exceeds the free ends of the lateral retention arms 23 of the snap-fit element 22, these retention arms 23 will expand and fix the moveable nanotube 6 in the first and upper end position. In this configuration, there is an electrical contact between the top electrode 12 and the bottom electrode 14 via the telescoping nanotube 2.

It is understood, that the telescoping nanotube 2 may be fixed by help of a mechanic interlock between the static support nanotube 4 and the moveable nanotube 6 (e.g. by the snap-fit element 22) and/or by help of mechanically fixing the moveable nanotube 6 to the top electrode 12, as illustrated in the embodiments of FIGS. 4 to 6.

Although the invention has been described hereinabove with reference to a specific embodiment, it is not limited to this embodiment and no doubt further alternatives will occur to the skilled person that lie within the scope of the invention as claimed.

REFERENCE SIGNS

2 telescoping nanotube
4 static support nanotube
6 moveable nanotube
8 memory cell
10 FPROM cell
12 top electrode
14 bottom electrode
15 free end
16 adhesive
18 first agent
20 second agent
22 snap-fit element
23 retention arms
E electric field

The invention claimed is:

1. A field programmable read-only memory (FPROM) device, comprising a memory-cell having a switching element for storing bit information, the switching element providing a switchable electrical connection between a word line and a bit line, wherein the switching element comprises a static body and a movable connecting element and the switchable electrical connection is non-volatile, wherein the switching element is movable between a first end position and a second end position, and is conductive in the first end position and non-conductive in the second end position, and wherein for protection of the bit information, the memory-cell is configured to interlock the movable connecting element in the first end position.

2. The FPROM-device according to claim 1, wherein the movable connecting element and the static body are permanently electrically connected.

3. The FPROM-device according to claim 2, wherein the switching element is a telescoping nanotube, and wherein the static body is a first static support nanotube and the movable connecting element is a second nanotube that is movable with respect to the first nanotube.

4. The FPROM-device according to claim 1, wherein the memory-cell is configured to interlock the movable connecting element in the first end position mechanically.

5. The FPROM-device according to claim 4, wherein the memory-cell is configured to interlock the static body and the movable connecting element with respect to each other.

6. The FPROM-device according to claim 5, wherein the static body comprises a locking element for interlocking the movable connecting element.

7. The FPROM-device according to claim 6, wherein the locking element is a micromechanical snap-fit element.

8. The FPROM-device according to claim 7, wherein the memory-cell further comprises a top and a bottom electrode, wherein the static body is coupled to the bottom electrode and the movable connecting element is configured to provide a mechanical contact to the top electrode in the first end position, and wherein memory-cell is further configured to interlock the top electrode and the movable connecting element with respect to each other.

9. The FPROM-device according to claim 8, wherein a free end of the moveable connecting element and/or at least a contact area of the top electrode comprises an adhesive.

10. The FPROM-device according to claim 9, wherein the adhesive is glue or a two component adhesive.

11. The FPROM-device according to claim 1, wherein the memory-cell is configured to interlock the static body and the movable connecting element with respect to each other.

12. The FPROM-device according to claim 11, wherein the static body comprises a locking element for interlocking the movable connecting element.

13. The FPROM-device according to claim 12, wherein the locking element is a micromechanical snap-fit element.

14. The FPROM-device according to claim 1, wherein the memory-cell further comprises a top and a bottom electrode, wherein the static body is coupled to the bottom electrode and the movable connecting element is configured to provide a mechanical contact to the top electrode in the first end position, and wherein memory-cell is further configured to interlock the top electrode and the movable connecting element with respect to each other.

15. The FPROM-device according to claim 14, wherein a free end of the moveable connecting element and/or at least a contact area of the top electrode comprises an adhesive.

16. The FPROM-device according to claim 15, wherein the adhesive is glue or a two component adhesive.

* * * * *